(12) United States Patent
Chiou et al.

(10) Patent No.: US 9,123,436 B2
(45) Date of Patent: Sep. 1, 2015

(54) ADAPTIVE DATA-RETENTION-VOLTAGE REGULATING SYSTEM FOR SRAM

(71) Applicant: NATIONAL CHENG KUNG UNIVERSITY, Tainan (TW)

(72) Inventors: Lih-Yih Chiou, Tainan (TW); Chi-Ray Huang, Tainan (TW); Kuan-Lin Wu, Tainan (TW)

(73) Assignee: National Cheng Kung University, Tainan (TW)

( * ) Notice: Subject to any disclaimer, the term of this patent is extended or adjusted under 35 U.S.C. 154(b) by 0 days.

(21) Appl. No.: 14/334,690

(22) Filed: Jul. 18, 2014

(65) Prior Publication Data

US 2015/0092477 A1    Apr. 2, 2015

(30) Foreign Application Priority Data

Sep. 27, 2013   (TW) .............................. 102134995 A

(51) Int. Cl.
*G11C 5/14* (2006.01)
*G11C 11/417* (2006.01)
*G06F 1/26* (2006.01)

(52) U.S. Cl.
CPC ................ *G11C 11/417* (2013.01); *G06F 1/26* (2013.01)

(58) Field of Classification Search
CPC .................................. G11C 11/417; G06F 1/26
USPC .................................. 365/226, 228, 206, 154
See application file for complete search history.

(56) References Cited

U.S. PATENT DOCUMENTS

| 6,389,505 B1 * | 5/2002 | Emma et al. ................... 711/106 |
| 7,079,421 B2 * | 7/2006 | Yaoi et al. ................. 365/185.24 |
| 7,751,270 B2 * | 7/2010 | Geens et al. ................... 365/229 |
| 8,355,277 B2 * | 1/2013 | Cheng et al. ................... 365/154 |
| 2011/0149672 A1 * | 6/2011 | Fukuoka ....................... 365/226 |

FOREIGN PATENT DOCUMENTS

TW           201037720 A1    10/2010

* cited by examiner

*Primary Examiner* — Viet Q Nguyen
(74) *Attorney, Agent, or Firm* — Rosenberg, Klein & Lee

(57) ABSTRACT

An adaptive data-retention-voltage regulating system for static random-access memory (SRAMs) is revealed. The system includes a power supply unit, a data-retention-voltage (DRV) monitor cell for monitoring static noise margin (SNM) of SRAM, a data loss detector for generating a data loss signal, and a dynamic regulating controller that receives the data loss signal for generating a refresh signal and a switch signal. The DVR monitor cell consists of a DRV monitor circuit mounted with a plurality of memory cells, a reset signal generating circuit for resetting the DRV monitor circuit, and an adaptive variation control circuit that generates noise bias according to leakage current to adjust reaction speed of the DRV monitor circuit correspondingly.

9 Claims, 5 Drawing Sheets

ADAPTIVE DATA-RETENTION-VOLTAGE REGULATING SYSTEM FOR SRAM

BACKGROUND OF THE INVENTION

1. Fields of the Invention

The present invention relates to an adaptive data-retention-voltage regulating system for static random-access memory (SRAMs), especially to an adaptive data-retention-voltage regulating system for static random-access memory (SRAMs) that reduces leakage power by using power gating. Moreover, data-retention-voltage is dynamically regulated according to process, voltage and temperature (PVT) variations. Thus leakage power of the SRAM at the stand-by mode is significantly decreased. By using dynamic regulation mechanism of closed-loop, the virtual supply voltage is maintained at data-retention-voltage. Without causing data loss, the leakage power is reduced more.

2. Descriptions of Related Art

SRAM is for storage of various information. SRAM generally consists of three main architectural blocks: a SRAM cell array, a peripheral circuit including address decoder/Y pass, amplifier, write circuit etc., and an I/O circuit. A basic unit of the SRAM cell array is a memory cell composed of two p-type metal oxide semiconductor (PMOS) load transistors, two n-type metal oxide semiconductor (NMOS) driver transistors and two NMOS access transistors. The memory cells are arranged in an array. Moreover, low-power design plays an important role in electronics (portable devices, wireless sensor network, WSN, bio-electronics, etc.) since energy conservation has become a universal concern. However, SRAM inside electronics typically occupies large area in a System-on-a-chip (SoC) and accounts for system static power dissipation/leakage power.

In order to reduce leakage power at standby mode, lowering the supply voltage to data-retention-voltage (DRV) is a common and effective way. The Data Retention Voltage (DRV) is the minimum standby voltage at which an SRAM array can preserve its data. That is the supply voltage at which the Static Noise Margin (SNM) of the SRAM cell in standby mode reduces to zero. With the design of Advanced Process, DRV increases with process variation. This causes a challenge for voltage scaling mechanism and leakage power reduction. Moreover, the variations of DRV are larger than the conventional process. In order to deal with worst case, the SRAM cell tends to have higher DRV and the leakage power remains the same. For example, data-retention-voltage of each SRAM Cell is different due to impact of process, voltage and temperature (PVT) variations on DRV. In order to make all data in SRAM hold under VDD scaling, the normal operation voltage of SRAM should be higher than the maximum DRV of memory cells of SRAM. However, at the design stage, there is no way to learn all the conditions of the chip. Thus the worst case should be taken into consideration while determining the normal operation voltage at the standby mode. This cause the whole memory cells of SRAM have higher DRV. Under such condition, the leakage power remains high. Furthermore, the probability of the worst case is quite low during operation of the SRAM. Thus most of the time, the normal operation voltage at the standby mode is able to be reduced.

Refer to Taiwanese Pat. Pub. No. 201037720 "integrated circuit structure", an integrated circuit structure includes an active power supply line, a data-retention power supply line, a first memory macro and a second memory macro. The first and the second memory macros are connected to the active power supply line and the data-retention power supply line. Each memory macro includes a memory cell array and a switch. The switch is configured to switch a connection between connecting the memory cell array to the active power supply line and connecting the memory cell array to the data-retention power supply line. A low leakage current mode control pin is coupled to the switch. The switch connects the active power supply line and the data-retention power supply line to the memory cell array according to a signal of the low leakage current mode control pin. Thereby the voltage of the data-retention power supply is generated by a voltage generator while the voltage generator is outside the memory macro. Thus the voltage generator can be designed into a complicated circuit. The memory reduces the leakage current without sacrificing the data availability. However, while in use, the voltage generator generates normal operation voltage at the standby mode by voltage converters such as dc-dc converters or linear regulators while the conversion efficiency of the voltage converter is not ideal. The voltage converters lead to additional power consumption and conversion time of the system. The scaling of the normal operation voltage also lowers the conversion efficiency of the voltage generator. Thus there is a power loss and the voltage conversion takes longer time. From the point of view of the system, the above design is unable to achieve higher reduction of the leakage power. Moreover, the conventional techniques uses external data retention power for voltage supply and the external data retention power is not so sensitive to PVT variations. Thus the memory reduces the leakage current without sacrificing the data availability. The normal supply voltage of the memory at the standby mode is a fixed value. The change of the DRV can't be regulated dynamically when the DRV is changed due to impact of certain variations (such as voltage or temperature variations) that change with time.

SUMMARY OF THE INVENTION

Thus there is a room for improvement and a need to provide a novel design of SRAM that overcomes the shortcoming of high static power dissipation of the SRAM available now caused by leakage power.

Therefore it is a primary object of the present invention to provide an adaptive data-retention-voltage regulating system for SRAMs that reduces virtual supply voltage of SRAM by power gating and dynamically adjusts DRV according to PVT variations without using voltage converters. Thus the leakage power of the SRAM at the standby mode is dramatically reduced. The virtual supply voltage is maintained at DRV by dynamic regulation mechanism of the closed-loop and more leakage power is reduced without loss of data.

In order to achieve the above object, an adaptive data-retention-voltage regulating system for SRAMs of the present invention includes a power supply unit, a DRV monitor cell, a data loss detector, and a dynamic regulating controller. The power supply unit consists of a primary power transistor and a secondary power transistor connected to each other for voltage supply of SRAM. The size of the secondary power transistor is no more than that of the primary power transistor. The secondary power transistor is turned off at the active mode and is turned on while at the standby mode and dynamic regulation is required. The DRV monitor cell is for monitoring Static Noise Margin (SNM) of SRAM and is composed of a DRV monitor circuit mounted with a plurality of memory cells of the SRAM, a reset signal generating circuit for resetting the DRV monitor circuit, and an adaptive variation control circuit that generates noise bias according to leakage current for adjusting reaction speed of the DRV monitor circuit. The leakage current is affected by PVT variations. A first node of each of the memory cells are connected to one another and a second node of each of the memory cells are connected to one another so as to average out random variation. The data loss detector is connected to the first node and the second node respectively. When the voltage of the data loss detector reverses, a data loss signal is generated by the data loss detector. As to the dynamic regulating controller, it is used to receive the above data loss signal and then generate a refresh signal and a switch signal respectively. The refresh signal and the switch signal are respectively sent to the reset signal generating circuit and the secondary power transistor. Thereby the system reduces virtual supply voltage by power gating and dynamically regulates the DRV according to PVT variations. Therefore the leakage power of the SRAM at the standby mode is significantly reduced.

The adaptive variation control circuit further includes a dynamic bias generating circuit mounted with a plurality of memory cells of the SRAM and a variation input circuit that receives the noise bias. The dynamic bias generating circuit is for monitoring PVT variations and generating corresponding noise bias that is sent to the variation input circuit. Thus the reaction speed of the DRV monitor circuit is regulated dynamically and dynamic regulation of closed-loop is completed without data loss.

The DRV monitor cell has at least 100 mV noise margin more than the SRAM. That means the DRV of the DRV monitor cell is at least 100 mV higher than that of the SRAM so as to ensure the safety of data in the SRAM.

The data loss detector can be a Wilson Current Mirror level shifter. When the data loss detector detects that the voltage of the first node and the voltage of the second node reverse, the data loss detector generates the data loss signal. Then the dynamic regulating controller sends the switch signal to turn on the secondary power transistor and raise the voltage at a third node. The reset signal generating circuit resets the DRV monitor cell to make the DRV monitor cell monitor the static noise margin of the SRAM again.

The reset signal generating circuit is used to make the potential level of the first node become equal to that of the third node and the potential level of the second node become the ground potential level.

The number of the memory cells of the DRY monitor circuit is equal to the number of the rows of the SRAM architecture.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1:
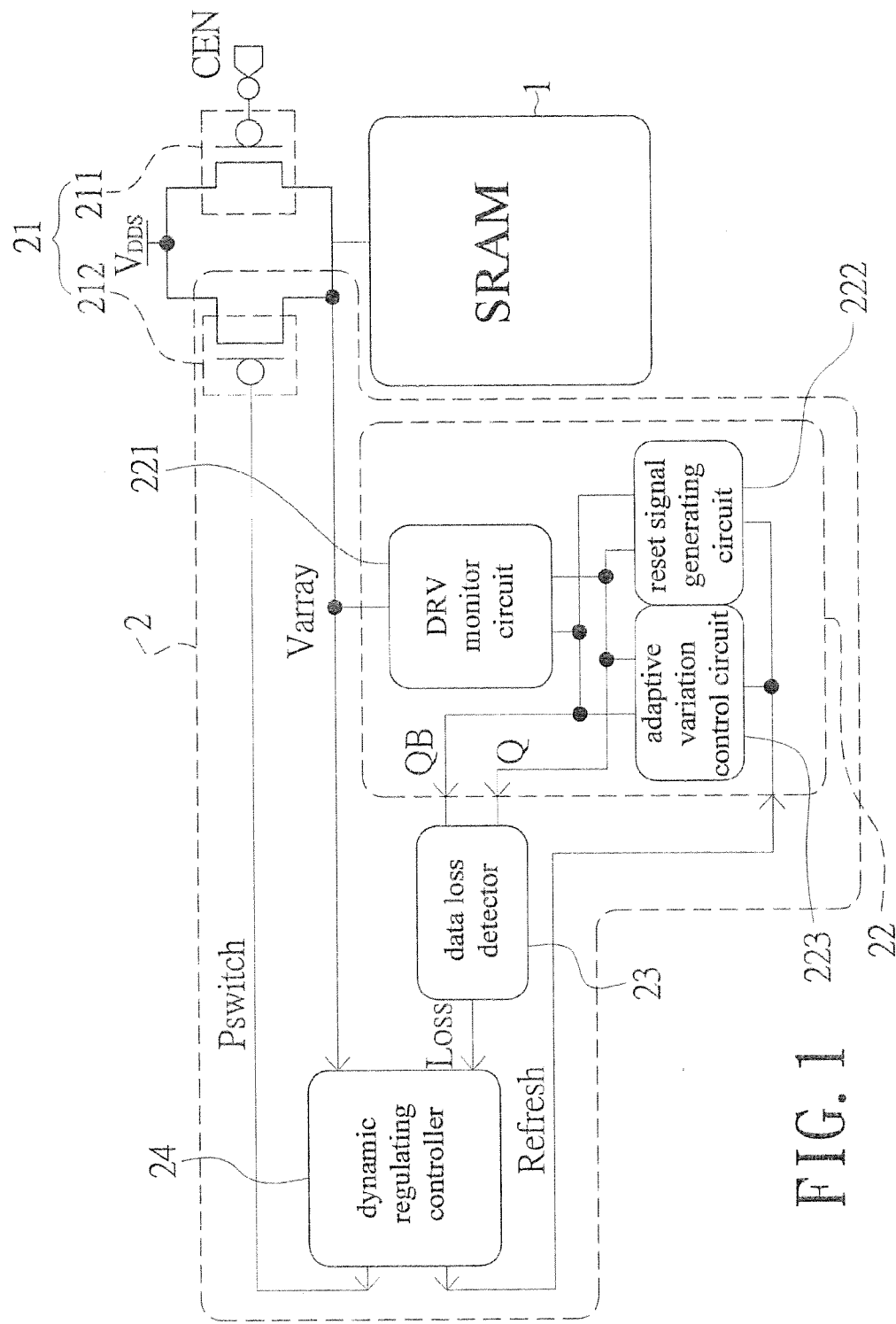
FIG. 1 is a block diagram showing electrical connections of an adaptive data-retention-voltage regulating system for SRAMs according to the present invention.

Refer to FIG. 1, an adaptive data-retention-voltage regulating system for SRAMs according to the present invention includes a power supply unit 21, a data-retention-voltage (DRV) monitor cell 22, a data loss detector 23, and a dynamic regulating controller 24.

The power supply unit 21 consists of a primary power transistor 211 and a secondary power transistor 212 connected to each other for voltage supply of SRAM 1. The size of the secondary power transistor 212 is no more than that of the primary power transistor 211. In an embodiment, the primary power transistor 211 and the secondary power transistor 212 can be PMOS transistors. The secondary power transistor 212 is turned off at the active mode. The secondary power transistor 212 is turned on while at the standby mode and dynamic regulation is required.

Figure 2:
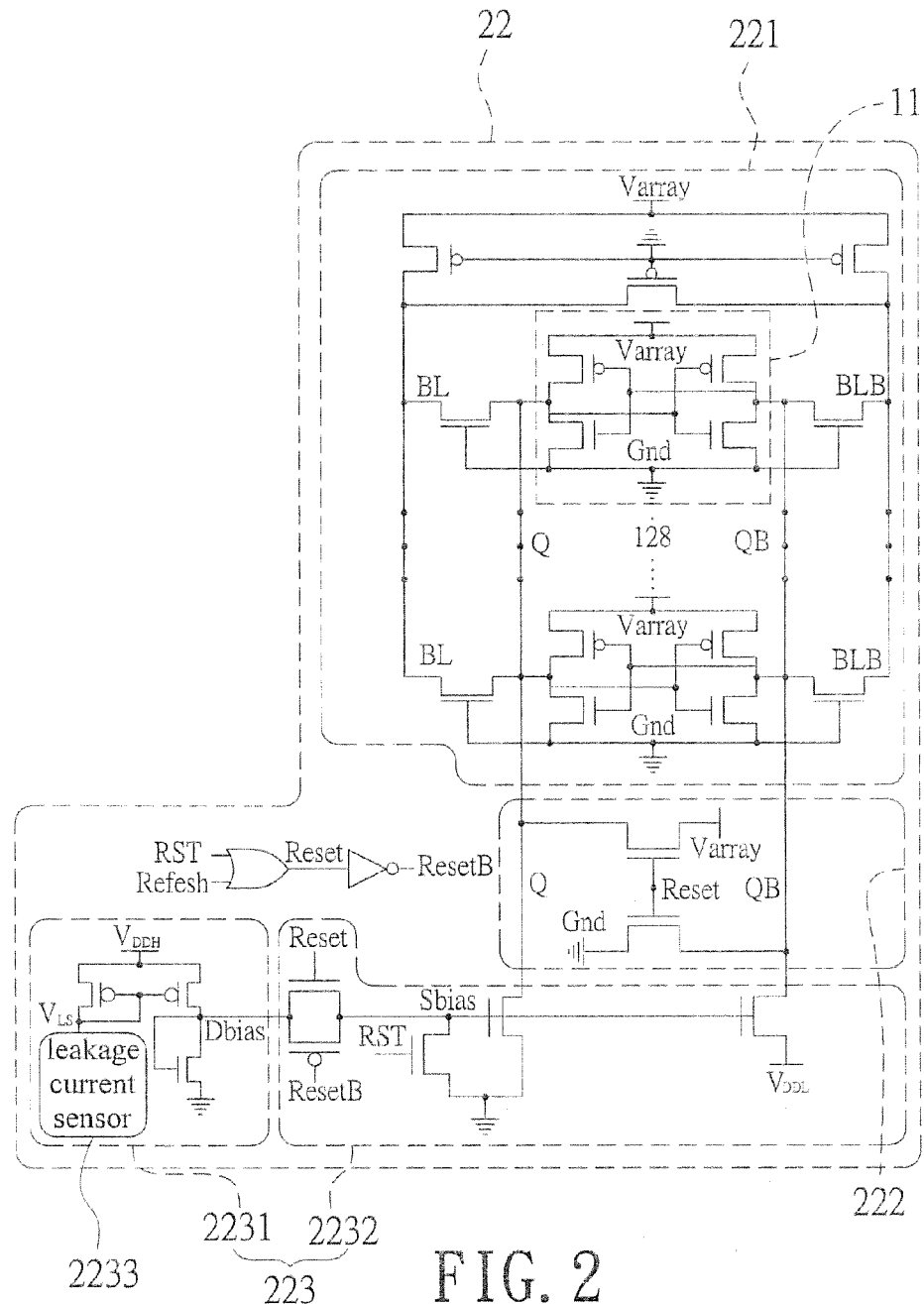
FIG. 2 is a circuit diagram of a data-retention-voltage (DRV) monitor cell of an embodiment according to the present invention.

The DRV monitor cell 22 is used to monitor Static Noise Margin (SNM) of the SRAM 1 and is composed of a DRV monitor circuit 221 mounted with a plurality of memory cells 11 of the SRAM 1, a reset signal generating circuit 222 for resetting the DRV monitor circuit 221, and an adaptive variation control circuit 223 that generates noise bias according to leakage current to adjust reaction speed of the DRV monitor circuit 221 correspondingly. Refer to FIG. 2, in this embodiment, the DRV monitor circuit 221 is mounted with 128 memory cells 11 of SRAM 1. The number of the memory cells 11 mounted is not limited to 128. It varies according to the structure of SRAM 1 and can be 256, 512 or 1024. The number of the memory cells 11 of the DRV monitor circuit 221 is equal to the number of the rows of the SRAM architecture. A first node Q of each memory cell 11 is connected to one another and a second node QB of each memory cell 11 is connected to one another so as to average out the random variation. The leakage current is affected by Process Voltage Temperature (PVT) variations. Moreover, the reset signal generating circuit 222 is used to make the potential level of the first node Q become equal to that of the third node $V_{array}$ (virtual supply voltage) and the potential level of the second node QB become the ground potential level. It should be noted that the DRV monitor cell 22 has at least 100 mV noise margin more than the SRAM 1 for ensuring the safety of data in the SRAM 1. 100 mV noise margin is only an embodiment of the present invention and the noise margin difference is not limited to 100 mV. People skilled in the art know that the noise margin difference can be larger or smaller than 100 mV as long as the DRV of the DRV monitor cell 22 is higher than the DRV of the SRAM 1.

Figure 3:
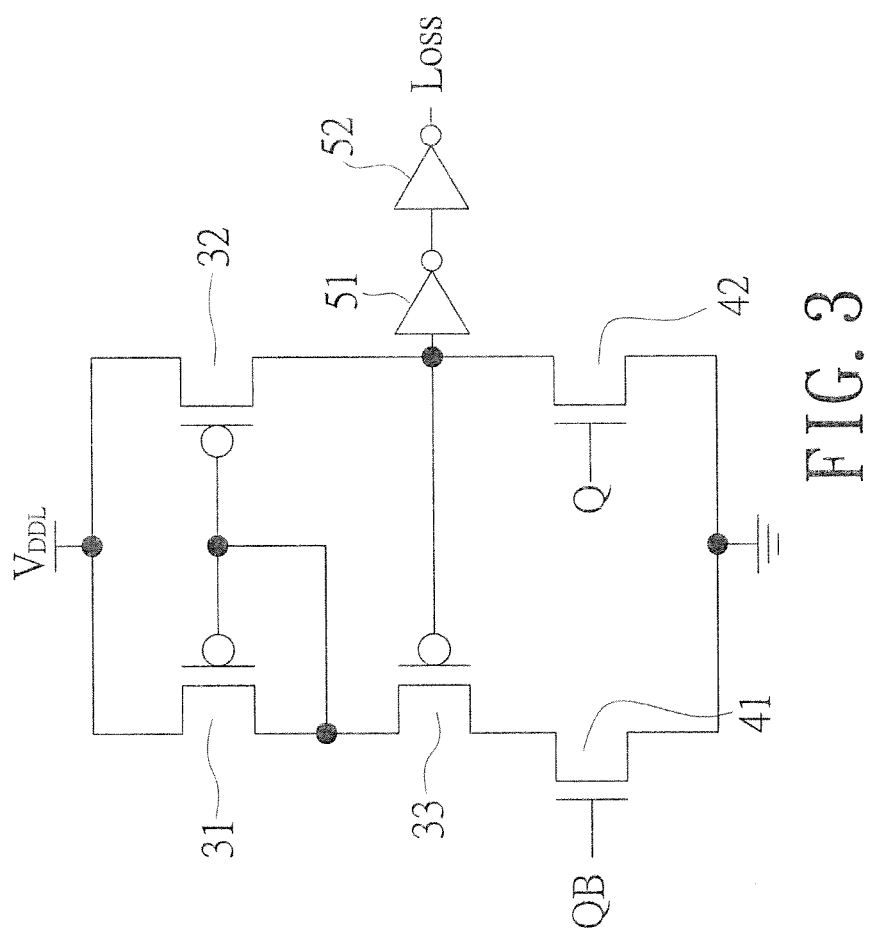
FIG. 3 is a circuit diagram of a data loss detector of an embodiment according to the present invention.

The data loss detector 23 is respectively connected to the first node Q and the second node QB. When its voltage reverses, a data loss signal Loss is generated. Refer to FIG. 3, the data loss detector 23 can be a Wilson Current Mirror level shifter. When the DRV monitor cell 22 detects that the voltage at the third node is close to the DRV, it makes the voltage at the first node Q and the voltage at the second node QB become quite close to the value of DRV. This value is much lower than the value of the normal operation voltage. An output end of the data loss detector 23 is connected to the dynamic regulating controller 24 that works at a voltage level higher than the DRV. Thus the data loss detector 23 should have the function of level conversion. In this embodiment, the data loss detector 23 is posed of two PMOS transistors 31, 32 connected to each other at the gates, two NMOS transistors 41, 42 connected to each other at sources and connected to a ground, a PMOS transistor 33 connected to the PMOS transistor 31 and the NMOS transistor 41 respectively at the source and the drain thereof, and two inverters 51, 52 connected to the PMOS transistors 32, 33 and the NMOS transistor 42. The gates of the NMOS transistors 41, 42 are respectively connected to the first node Q and the second node QB. This is only an embodiment of the present invention, the data loss detector 23 can also be replaced by Type 1 and Type II level converters revealed in the study of S. N. Wooters and colleagues published in IEEE Transactions on Circuits and Systems II—Express Briefs, 2010; 57(4):290-294, 2010 or the equivalents disclosed in other articles. The level converters mentioned above have the same effects and technical advantages so that they are considered as equivalent change and modification of the present invention. Moreover, while the data loss detector 23 detects that the voltage of the first node Q and the voltage of the second node QB reverse, a data loss signal Loss is generated. Thus a switch signal $P_{switch}$ is sent from the dynamic regulating controller 24 to turn on the secondary power transistor 212 and the voltage at the third node $V_{array}$ is raised. The reset signal generating circuit 222 resets the DRV monitor cell 22 so as to make the DRV monitor cell 22 monitor the static noise margin of the SRAM 1 again.

Figure 4:
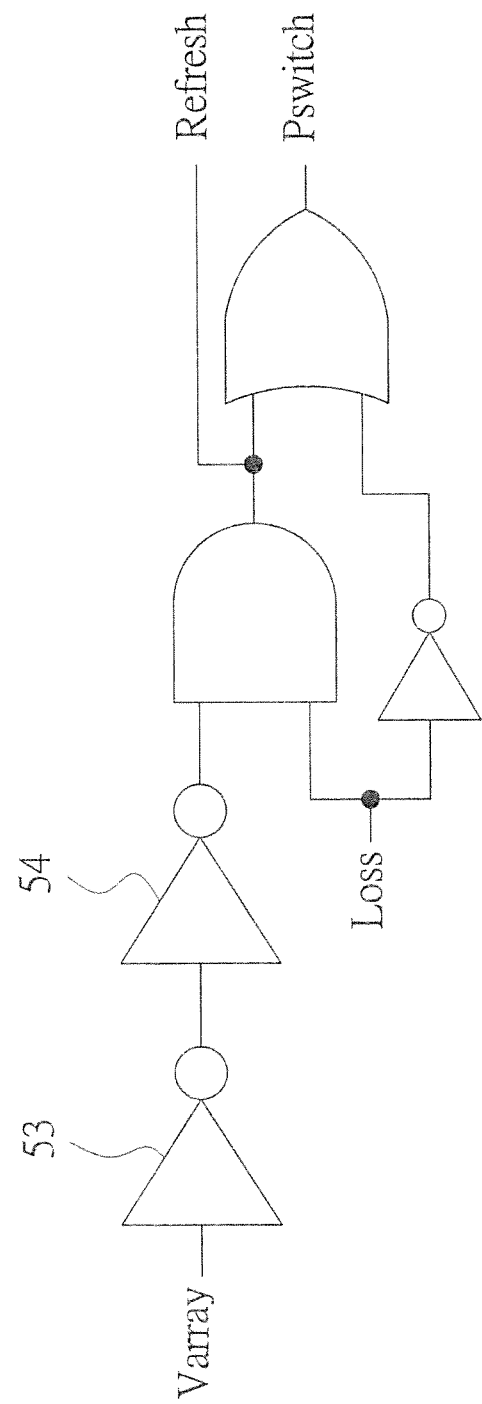
FIG. 4 is a circuit diagram of a dynamic regulating controller of an embodiment according to the present invention.

The dynamic regulating controller 24 receives the data loss signal Loss to generate a refresh signal Refresh and a switch signal $P_{switch}$. The refresh signal Refresh and the switch signal $P_{switch}$ are respectively sent to the reset signal generating circuit 222 and the secondary power transistor 212. As shown in FIG. 4, a logic circuit of the dynamic regulating controller 24 is disclosed.

Moreover, as shown in FIG. 2, the adaptive variation control circuit 223 further includes a dynamic bias generating circuit 2231 mounted with a plurality of memory cells 11 of the SRAM 1 and a variation input circuit 2232 that receives the noise bias Dbias. The dynamic bias generating circuit 2231 is for monitoring leakage current caused by PVT variations and further generating a noise bias Dbias correspondingly that is sent to the variation input circuit 2232. The impact of PVT variations on the leakage current is monitored by a leakage current sensor 2233. The monitoring result is converted into a noise bias Dbias that is sent to the variation input circuit 2232. The larger the leakage current, the larger the noise bias Dbias generated. This accelerates the reaction speed of the DRV monitor circuit 221. On the other hand, the generated noise bias Dbias is smaller when the leakage current is getting smaller. Without data loss in the SRAM 1, the dynamic adjustment of closed-loop has been completed. Moreover, the dynamic bias generating circuit 2231 is driven by a high potential power supply $V_{DDH}$ (such as 1.2V) while the reset signal generating circuit 222, the adaptive variation control circuit 223, the data loss detector 23, and the dynamic regulating controller 24 are all driven by a low potential power supply $V_{DDL}$ (such as 0.6V).

Figure 5:
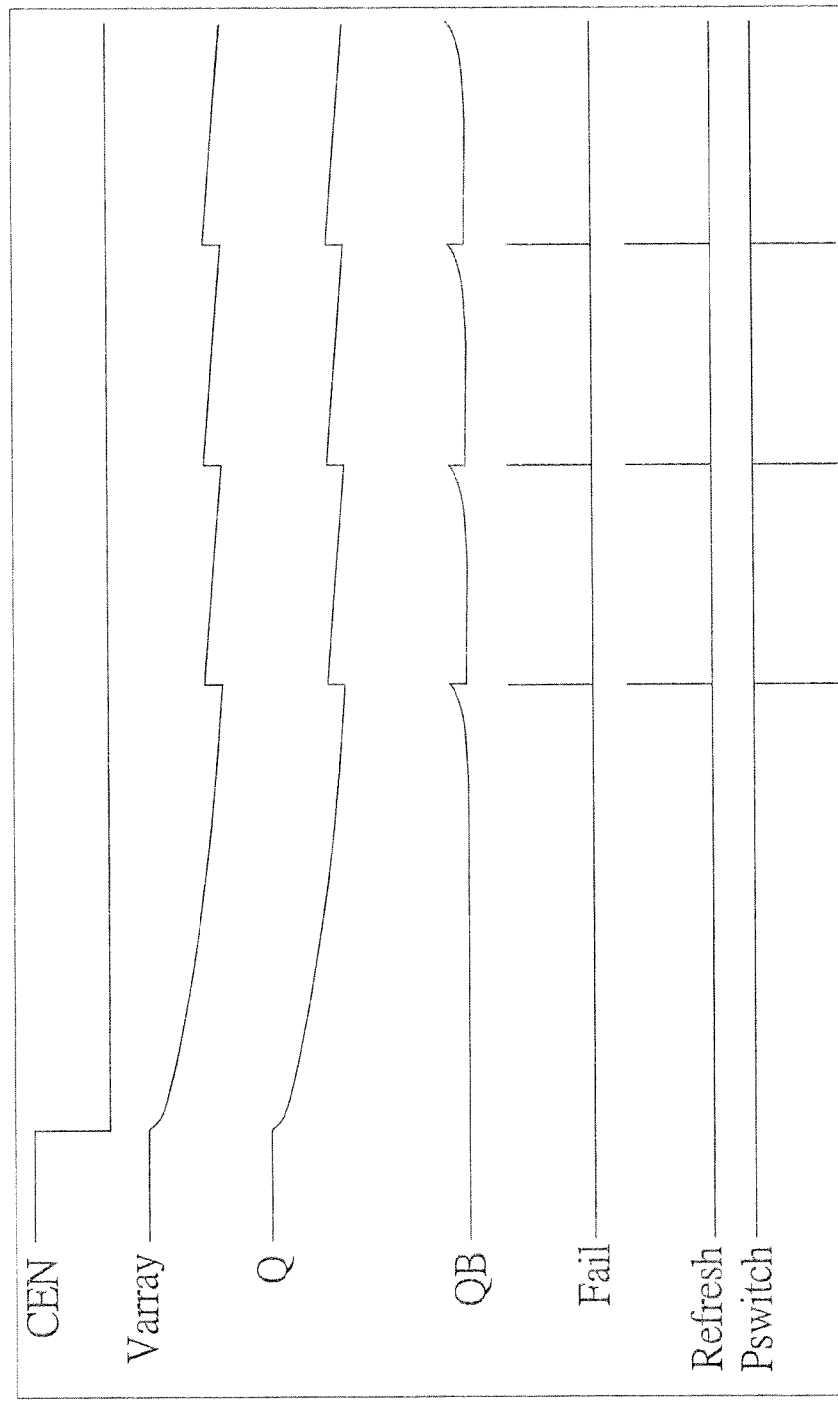
FIG. 5 is a schematic drawing waveform of various signals of an embodiment according to the present invention.

While in use, the primary power transistor 211 is turned on and the SRAM 1 is at the active mode when the chip enable signal CEN is High. Now the adaptive data-retention-voltage regulating system 2 is not working. When chip enable signal CEN is Low, the primary power transistor 211 is turned off and the SRAM memory 1 is changed to the standby mode. At this moment, the voltage at the third node $V_{array}$ is lowered by the leakage current of the SRAM 1. Thus the reduction of the virtual supply voltage is achieved. When the voltage is reduced to the DRV of the DRV monitor cell 22, the voltage of the first node Q and the voltage of the second node QB reverse so that the data loss signal Loss is generated. Then the switch signal $P_{switch}$ is shifted to Low so as to turn on the secondary power transistor 212 and further charge the third node $V_{array}$. Once the voltage at the third node $V_{array}$ is elevated to the transition point (safe voltage), the switch signal $P_{switch}$ is shifted to High for turning off the secondary power transistor 212 and generating a refresh signal Refresh that is High and is used for resetting the DRV monitor circuit 221. The inverters 53, 54 of the dynamic regulating controller 24 are designed as skew inverters. The value of the transition voltage of the inverters 53, 54 can be a half of the value of the low potential power supply $V_{DDL}$, which is used as a safety range of the voltage at the third node $V_{array}$ while the third node is charged by the secondary power transistor 212. After the resetting of the DRV monitor circuit 221 being completed, the data loss signal Loss is decreased to Low and the refresh signal Refresh is shifted to Low to turn off the resetting. The voltage at the third node $V_{array}$ is reduced again due to leakage current of the SRAM 1. Thus an operation cycle is formed. Refer to FIG. 5, waveforms of various signals of an embodiment of the present invention is revealed.

Within a period after the secondary power transistor 212 is turned off and the data loss signal Loss is changed to Low, the switch signal $P_{switch}$ is switched to Low. And the secondary power transistor 212 is turned on again to charge the third node once the switch signal $P_{switch}$ hasn't been changed to Low. Yet the voltage at the third node $V_{array}$ has already dropped down to the DRV. This is to ensure the voltage at the third point $V_{array}$ will not be lower than the DRV within a period required for shifting of the data loss signal Loss and prevent reading and writing errors.

In summary, the present invention has following advantages:
1. The adaptive data-retention-voltage regulating system for SRAMs of the present invention reduces virtual supply voltage by power gating and changes Varray to the DRV in an adaptive way according to PVT variations. Thus the leakage power of the SRAM at the standby mode is significantly reduced.
2. The adaptive variation control circuit uses dynamic bias mechanism. The impact of PVT variations on the leakage current is monitored by a leakage current sensor having the same number of memory cells which is equal to the DRV monitor circuit. The monitoring result is converted into a noise bias. The noise bias generated is getting larger when the leakage current is larger so as to dynamically adjust the reaction speed of the DRV monitor circuit. The dynamic adjustment of closed-loop has been completed without data loss.
3. No voltage converter is required in the adaptive data-retention-voltage regulating system for SRAMs of the present invention so that the cost of the system is dramatically reduced.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An adaptive data-retention-voltage regulating system for static random-access memory (SRAM) comprising:
   a power supply unit having a primary power transistor and a secondary power transistor connected to each other while the size of the secondary power transistor is no more than the size of the primary power transistor; the power supply unit used for voltage supply of the SRAM:
   a data-retention-voltage (DRV) monitor cell for monitoring static noise margin (SNM) of the SRAM and having a DRV monitor circuit mounted with a plurality of memory cells of the SRAM, a reset signal generating circuit for resetting the DRV monitor circuit, and an adaptive variation control circuit that generates noise bias according to leakage current for adjusting reaction speed of the DRV monitor circuit; a first node of each of the memory cells are connected to one another and a second node of each of the memory cells are connected to one another;

a data loss detector connected to the first node and the second node respectively and generating a data loss signal when voltage of the first node and voltage of the second node reverse; and a dynamic regulating controller that receives the data loss signal for generating a refresh signal and a switch signal that are sent to the reset signal generating circuit and the secondary power transistor respectively.

2. The system as claimed in claim 1, wherein the leakage current is caused by process, voltage and temperature (PVT) variations.

3. The system as claimed in claim 2, wherein the adaptive variation control circuit includes a dynamic bias generating circuit mounted with a plurality of memory cells of the SRAM and a variation input circuit that receives the noise bias; the dynamic bias generating circuit monitors the PVT variations and generates the noise bias correspondingly that is sent to the variation input circuit.

4. The system as claimed in claim 1, wherein the secondary power transistor is turned off at an active mode; the secondary power transistor is turned on while at a standby mode and dynamic regulation is required 5. The system as claimed in claim 1, wherein the DRV monitor cell has at least 100 mV noise margin more than the SRAM.

6. The system as claimed in claim 1, wherein the data loss signal is generated when the data loss detector detects that the voltage of the first node and the voltage of the second node reverse and the dynamic regulating controller sends the switch signal to turn on the secondary power transistor; thus voltage at a third node is raised and the reset signal generating circuit resets the DRV monitor cell to make the DRV monitor cell monitor the static noise margin of the SRAM again.

7. The system as claimed in claim 6, wherein the reset signal generating circuit is used to make a potential level of the first node become equal to a potential level of the third node and a potential level of the second node become a ground potential level.

8. The system as claimed in claim 1, wherein the data loss detector is a Wilson Current Mirror level shifter.

9. The system as claimed in claim 1, wherein the number of the memory cells of the DRV monitor circuit is equal to the number of rows of the SRAM architecture.

* * * * *